United States Patent [19]
Patterson

[11] Patent Number: 5,821,816
[45] Date of Patent: Oct. 13, 1998

[54] INTEGER DIVISION VARIABLE FREQUENCY SYNTHESIS APPARATUS AND METHOD

[75] Inventor: Jeffery S. Patterson, Santa Rosa, Calif.

[73] Assignee: Hewlett-Packard Company, Palo Alto, Calif.

[21] Appl. No.: 873,784

[22] Filed: Jun. 12, 1997

[51] Int. Cl.$^6$ .................................................. H03L 7/18
[52] U.S. Cl. ............................ 331/1 A; 331/17; 331/11; 327/156; 327/159; 327/160; 327/105; 327/106; 327/107; 375/376
[58] Field of Search .................................. 327/159, 160, 327/105, 107, 106, 156, 1; 331/1 A, 11, 16, 17; 375/376

[56] References Cited

U.S. PATENT DOCUMENTS

| | | | |
|---|---|---|---|
| 3,217,267 | 11/1965 | Loposer | 331/16 |
| 3,555,446 | 1/1971 | Braymer | 331/16 |
| 3,582,810 | 6/1971 | Gillette | 331/10 |
| 3,928,813 | 12/1975 | Kingsford-Smith | 331/14 A |
| 4,179,670 | 12/1979 | Kingsbury | 331/10 |
| 4,519,091 | 5/1985 | Chu et al. | 377/44 |
| 4,536,718 | 8/1985 | Underhill | 331/16 |
| 5,038,117 | 8/1991 | Miller | 331/16 |

FOREIGN PATENT DOCUMENTS

| | | |
|---|---|---|
| 2026268 | 1/1980 | United Kingdom . |
| 2140232 | 10/1986 | United Kingdom . |

*Primary Examiner*—Arnold Kinkead
*Attorney, Agent, or Firm*—John L. Imperato

[57] ABSTRACT

A variable frequency synthesis apparatus and method use a phase prediction signal to enable integer division in the feedback path of a phase-lock-loop to provide an output signal at a rational frequency multiple of an applied reference signal. A fixed integer divide ratio is maintained within each period of the reference signal. The output signal provided by a variable frequency oscillator is frequency divided and is phase compared to the reference signal. The phase comparison produces a predictable, time-varying phase difference signal based on a known frequency difference between the output signal and the reference signal. The phase prediction signal cancels the predictable phase difference signal and isolates an phase error signal used to steer, or adjust, the frequency of the oscillator to precisely equal the rational frequency multiple of the applied reference signal when the phase error signal is minimized.

15 Claims, 5 Drawing Sheets

INTEGER DIVISION VARIABLE FREQUENCY SYNTHESIS APPARATUS AND METHOD

FIELD OF THE INVENTION

The present invention relates to variable frequency synthesizers and more particularly to a method and apparatus for generating signals at rational frequency multiples of an applied frequency reference signal.

BACKGROUND OF THE INVENTION

Frequency synthesizers are commonly used in communication systems and electronic instruments. Fractional-N frequency synthesizers employ non-integer, or fractional, division in the feedback path of a phase-lock-loop (PLL) in order to produce output signals at rational frequency multiples of a frequency reference signal. Typically, the non-integer division in the fractional-N synthesizer is implemented with an integer frequency divider and an associated controller which dynamically alters the divide ratio of the divider to produce an average divide ratio that approximates a desired non-integer divide ratio. Although fractional-N synthesizers are capable of producing output signals having low phase noise, these synthesizers have several performance disadvantages. For example, dynamically altering the frequency divide ratio generates noise, and the fractional division produces spurious signals which may degrade the performance of the instrument or system in which the fractional-N synthesizer is used.

SUMMARY OF THE INVENTION

According to the preferred embodiments of the present invention, a variable frequency synthesizer employs integer division within the feedback path of a phase-lock-loop (PLL) to provide an output signal at a rational frequency multiple of an applied frequency reference signal. By using integer division and incorporating a phase predictor in the PLL, low noise and low spurious signal levels are achieved at the synthesizer's output. The output signal, provided by a variable frequency oscillator, is frequency divided by an integer divisor and phase compared to the reference signal. The phase comparison produces a time-varying phase difference signal having an error component, and a predictable phase component due to the known frequency difference between the frequency-divided output signal and the reference signal. The phase predictor generates a prediction signal that is compared to the phase difference signal and cancels the predictable phase component. The comparison isolates the error component which is processed and then used to steer the frequency of the oscillator so that the frequency of the output signal precisely equals the chosen rational frequency multiple of the reference signal. According to the first preferred embodiment of the present invention, the variable frequency synthesizer is implemented using analog circuitry. According to the second preferred embodiment of the present invention, the variable frequency synthesizer is implemented using digital circuitry.

DETAILED DESCRIPTION OF THE PREFERRED EMBODIMENTS

Figure 1:
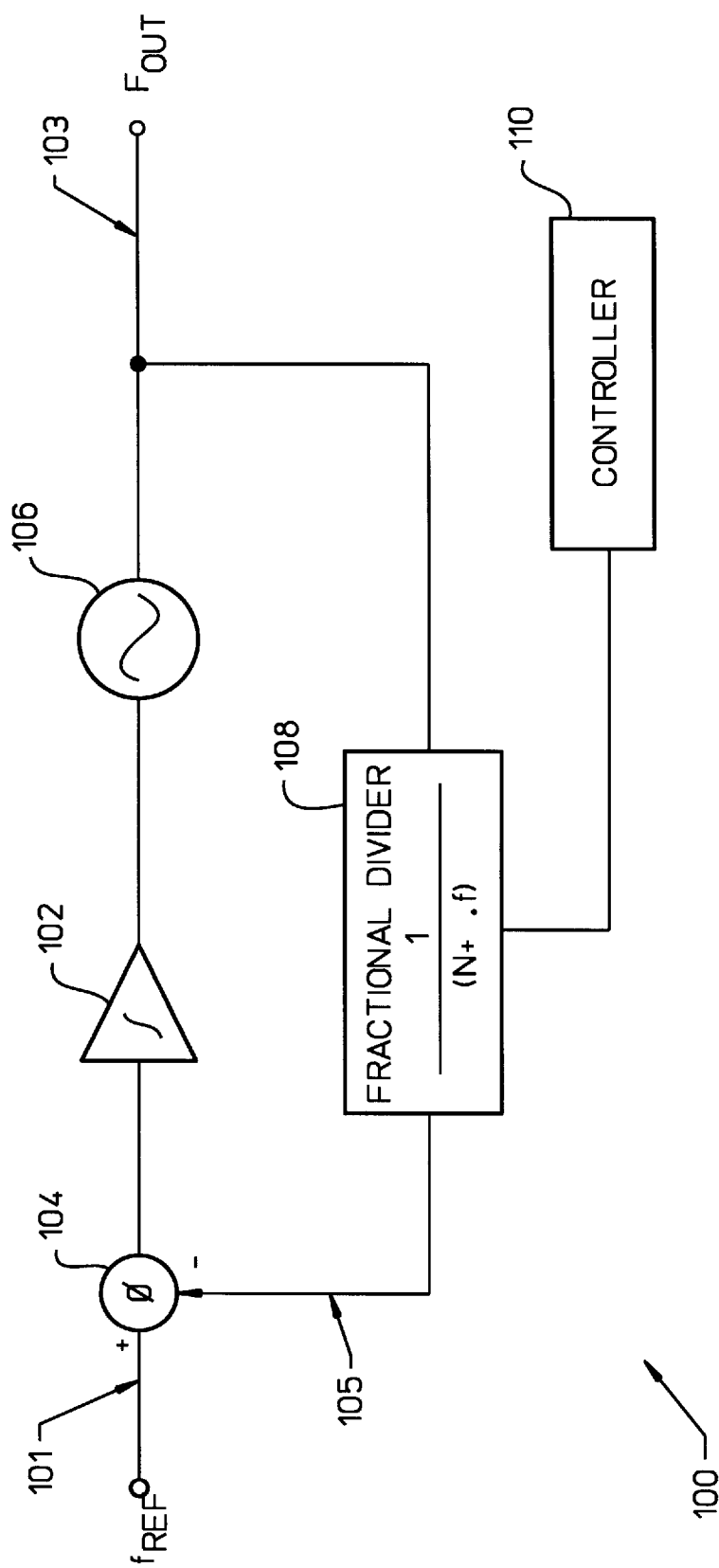
FIG. 1 shows a prior art fractional-N synthesize.

FIG. 1 shows a prior art fractional-N frequency synthesizer 100. The synthesizer 100 includes a phase-lock-loop (PLL) which has a loop integrator/filter 102, a phase detector 104, a voltage controlled oscillator (VCO) 106 and a frequency divider 108 in the feedback path of the PLL, that achieves fractional, or non-integer, frequency division. The non-integer division is implemented using the frequency divider 108 and an associated controller 110 that dynamically determines the divide ratio at each period of the frequency reference signal 101, so that the average divide ratio approximates the non-integer divide ratio to a desired accuracy. This type of fractional-N synthesizer 100 is described by Miller in U.S. Pat. No. 5,038,117. The dynamically determined divide ratio may be generated so as to shape the resulting phase noise spectrum to have reduced low-frequency spectral energy at the expense of increased high-frequency spectral energy. The high-frequency spectral energy is subsequently filtered by the integrator/filter 102 in the PLL.

While the spectral shaping of the noise in the fractional-N frequency synthesizer 100 provides an output signal 103 having low phase noise, the synthesizer 100 has a number of performance limitations. A first limitation is that high spurious signal levels may be present on the synthesizer 100's output signal 103. Since the output frequency of the divider is a non-integer, sub-multiple of the VCO output frequency $F_{OUT}$, the Nth harmonic of the divider's output signal 105 is slightly offset in frequency from the VCO's output frequency $F_{OUT}$. VCO's are highly susceptible to these harmonic signals and generate unwanted spurious signals on the synthesizer 100's output signal 103.

Figure 2:
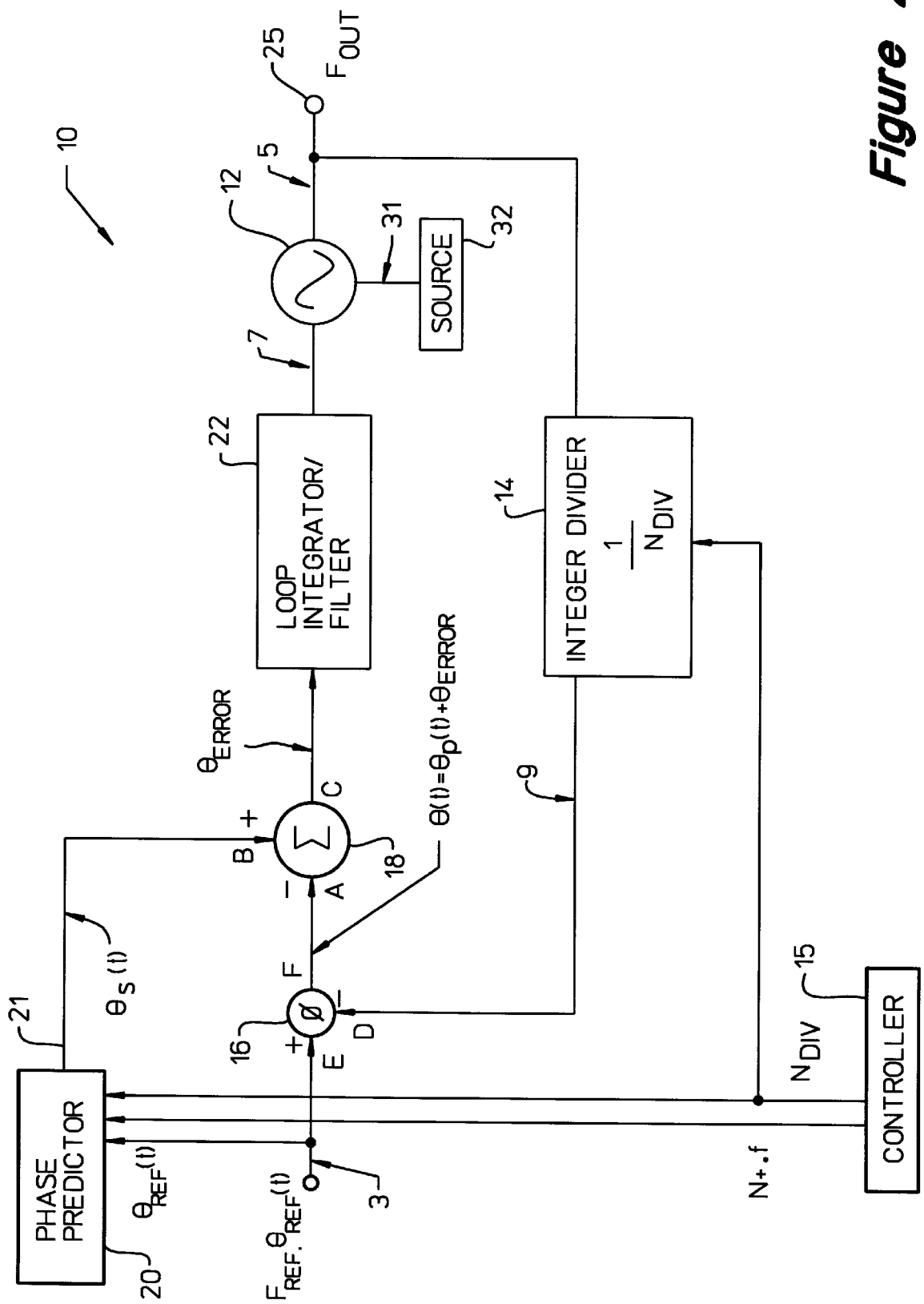
FIG. 2 shows an analog implementation of the frequency synthesizer constructed according to a first preferred embodiment of the present invention.

FIG. 2 shows the functional diagram of an analog implementation of a variable frequency synthesizer 10 constructed according to the first preferred embodiment of the present invention. The frequency synthesizer 10 includes a phase-lock-loop (PLL) having a variable frequency oscillator 12, an integer divider 14, a phase comparator 16, a summer 18, a phase predictor 20 and a loop integrator/filter 22. The variable frequency oscillator 12, which in this example is a voltage controlled oscillator (VCO), is controlled by a control signal 7 at an input terminal to provide a desired output signal 5 at frequency $F_{OUT}$ at an output terminal 25. Under phase-locked conditions of the PLL, the control signal 7 adjusts the output frequency $F_{OUT}$ to equal a rational frequency multiple of an applied reference signal 3, which has frequency $F_{REF}$. The rational frequency multiplier is equal to (N+.f), where N is an integer and .f is a fraction.

The output signal 5 present at the output terminal 25 of the frequency synthesizer 10 is coupled to the integer divider 14. The divider 14 divides the output frequency $F_{OUT}$ (equal to (N+.f)*$F_{REF}$) by an integer $N_{DIV}$, to produce a divided signal 9 having a frequency $F_{DIV}$ equal to (N+.f)*$F_{REF}$/$N_{DIV}$, when the PLL is locked. For a given output frequency $F_{OUT}$ this integer divide ratio $N_{DIV}$ remains static, thereby eliminating phase jitter that would be generated were the divide ratio dynamically varied from cycle to cycle of the reference signal 3. The divided signal 9 is coupled to a first input D of the phase comparator 16 and is phase compared to the reference signal 3 which is applied to a second input E of the phase comparator 16. Since the divided signal 9 and the reference signal 3 differ in frequency, a time-varying signal representing the phase difference θ(t) between the reference signal 3 and divided signal 9 results at the output of the phase comparator 16. The phase difference θ(t) includes a predictable phase component θp(t) and an error component $\theta_{ERROR}$. The predictable phase component θp(t) equals $\theta_{REF}(t) *(1-(N+.f)/N_{DIV})$, where $\theta_{REF}(t)=F_{REF}* t$ is the time-varying phase of the applied reference signal 3. The phase error $\theta_{ERROR}$ represents phase deviation of the VCO's output signal 5 from the predictable phase θp(t). The phase difference θ(t) is applied to a negative input A of the summer 18.

A phase predictor 20 generates a prediction signal θs(t) based on the phase component $\theta_{REF}(t)$ of the applied reference signal 3, the divide ratio $N_{DIV}$, the integer N and the fraction .f. The prediction signal θs(t) mimics the predictable phase component θp(t) and is applied to the positive input B of the summer 18. Subtraction of the phase difference θ(t) from the prediction signal θs(t) at the summer 18, isolates the phase error $\theta_{ERROR}$ at the output C of the summer 18. The phase error $\theta_{ERROR}$ is then processed by the loop integrator/filter 22 to generate the control signal 7 used to steer the frequency of the VCO 12. The action of the PLL minimizes the phase error $\theta_{ERROR}$ to provide an output signal 5 that is phase-locked to the applied reference signal 3 and that has frequency $F_{OUT}$ equal to $(N+.f)*F_{REF}$. The output frequency $F_{OUT}$ is varied by adjusting the values of the integer multiplier N and the fractional multiplier .f, and the divide ratio $N_{DIV}$. A controller 15 supplies the divide ratio $N_{DIV}$, the integer N and fractional portion .f to the phase predictor 20 and loads the divide ratio $N_{DIV}$ in the divider 14.

The functional elements of the frequency synthesizer 10 are implemented using a variety of known circuit elements. For example, in an analog implementation of the frequency synthesizer 10, the output signal 5 from the VCO 12 is applied to a programmable frequency divider 14. Except when the frequency $F_{OUT}$ is adjusted, the divide ratio $N_{DIV}$ of the divider remains static. The phase comparator 16 is implemented using a mixer with a lowpass filter (not shown) to eliminate high order mixing products. By selecting the divide ratio $N_{DIV}$ to be different from the integer portion N of the rational frequency multiplier (N+.f), the divided signal 9 differs in frequency from the reference signal frequency $F_{REF}$ by at least $(F_{REF}/N+1)$ Hz. Since this minimum frequency difference equals $F_{REF}* (1-N/N_{DIV})$, $N_{DIV}$ can be chosen to place the higher order mixing products generated by the phase comparator 16 outside the bandwidth of the PLL. This enables the mixing products to be filtered by the integrator/filter 22, thereby reducing spurious signal levels at the output 25 of the frequency synthesizer 10. Alternatively, the phase comparator 16 is implemented using an exclusive OR gate or other known type of phase comparator 16.

A pretune signal 31 from a voltage source 32 coarse-tunes the output frequency $F_{OUT}$ of the VCO 12 with sufficient accuracy to assure that the frequency $F_{DIV}$ of the divided signal 9 is positioned either above or below the frequency $F_{REF}$ of the reference signal 3, as required to match the polarity of the slope of the prediction signal θs(t) produced by the phase predictor 20. The phase predictor 20 is implemented with a function generator that is synchronized by the time-varying phase $\theta_{REF}(t)$ of the reference signal 3 to provide the prediction signal θs(t). Typically, the summer 18 and the loop integrator/filter 22 are implemented using operational amplifiers.

Figure 3:
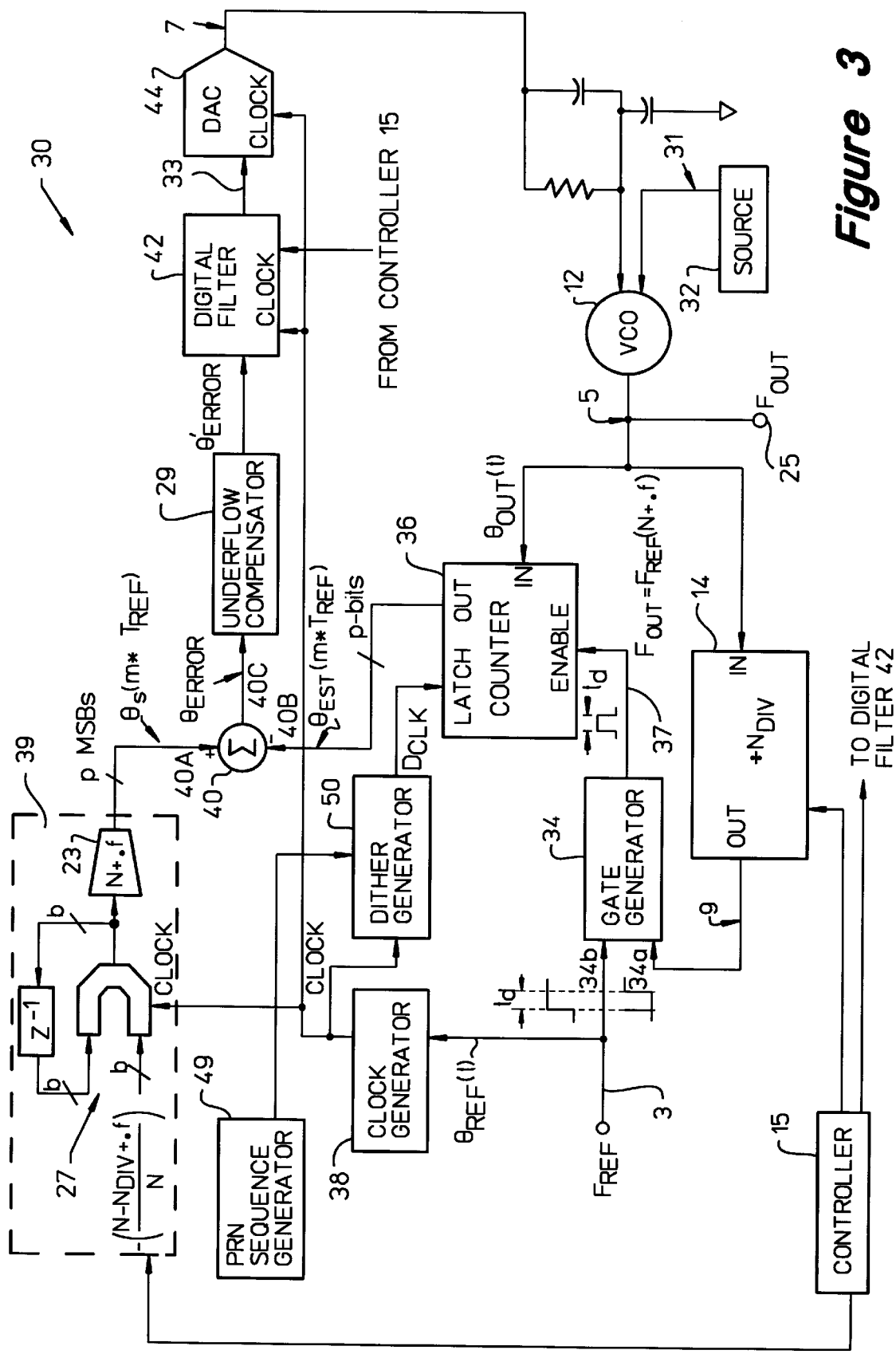
FIG. 3 shows a digital implementation of the frequency synthesizer constructed according to a second preferred embodiment of the present invention.

FIG. 3 shows a digital implementation of the frequency synthesizer constructed according to a second preferred embodiment of the present invention. With the exception of the VCO 12, which receives an analog pretune signal 31 and the control signal 7 to generate an analog output signal 5, the frequency synthesizer 30 is implemented digitally. The pretune signal 31, from a DAC or other voltage source 32, coarse-tunes the frequency $F_{OUT}$ of the VCO 12 while the control signal 7 fine-tunes the frequency of the VCO. A digital estimate $\theta_{EST}(m*T_{REF})$ of the time-varying phase $\theta_{OUT}(t)$ of the output signal 5 is generated using a gate generator 34 and a counter 36. The gate generator 34 determines a time interval td over which cycles of the output signal 5 are counted. The VCO output signal 5 is applied to the input of the counter 36 and is also applied to the divider 14. The divided signal 9, or terminal count 9, at the terminal count output of divider 14 is presented to a first input 34a of the gate generator 34 while the reference signal 3 is applied to a second input 34b of the gate generator 34. An enable signal 37 is generated from the arrival-time differential td between corresponding amplitude transitions (for example, the rising edges or falling edges) of the terminal count 9 and the reference signal 3 at the gate generator 34's inputs 34a, 34b. The enable signal 37 provided by the gate generator 34 is then applied to the enable input of the counter 36, to define a gate interval td over which cycles of the VCO output signal 5 are counted. Since the reference signal 3 and the terminal count 9 have unequal frequencies, the gate interval td is time-varying. The counter 36 self-resets after its content is latched by a latch signal Dclk. In U.S. Pat. No. 4,519,091, herein incorporated by reference, Chu et al. describe a method of latching the instantaneous contents of a high-speed counter 36 without interrupting the counting process.

When the output signal 5 is at the programmed frequency $F_{OUT}$ (equal to $(N+.f)*F_{REF}$), during each gate interval td the number of cycles of the output signal 5 gated to the counter is $(N+.f)*F_{REF}*td$. (N+.f) is the rational multiplier of the frequency $F_{REF}$ of the reference signal 3 and includes an integer multiplier N and a fractional multiplier .f. Since the phase $\theta_{REF}(t)$ of the reference signal 3 advances by $F_{REF}*td$ cycles within the gate interval td, the number of phase cycles advanced by the reference signal 3 in the interval td is:

$$\Delta\theta_{REF}(m*T_{REF})=\theta_{REF}(m*T_{REF}+td)-\theta_{REF}(m*T_{REF})$$

where $T_{REF}=1/F_{REF}$ and m is an integer indexing the cycle number of the reference signal 3. The number of cycles of the output signal 5 predicted to occur during the gate interval td is:

$$\Delta\theta_{REF}(m*T_{REF})*(N+.f).$$

The counted number of cycles of the output signal 5 at the output of the counter 36 is predictable since both $\Delta\theta_{REF}(m*T_{REF})$ and (N+.f) are known. This number is represented as a predictable phase term $\theta p(m*T_{REF})$. This predictable phase term $\theta p(m*T_{REF})=\lfloor \Delta\theta_{REF}(m*T_{REF})(N+.f) \rfloor$ where $\lfloor \ \rfloor$ indicates the truncate-to-integer function.

The truncate-to-integer function performed by the counter 36 causes the actual number of cycles of output signal 5 which may be a non-integer, to be rounded-off to an integer count, representing the number of completed output signal cycles. This rounding-off by the counter 36 generates quantization noise qE at the output of counter 36. A phase error $\theta_{ERROR}(m*T_{REF})$ due to noise and other phase deviations from the predicted phase of the VCO 12's output signal 5 is also present at the output of the counter 36. Taking into account the quantization noise qE and phase error $\theta_{ERROR}$ (m*$T_{REF}$), the digital estimate $\theta_{EST}$(m*$T_{REF}$) of the phase $\theta_{OUT}$(t) of the VCO's output signal 5 at the output of counter 36 is represented as:

$$\theta_{HST}(m * T_{REF}) = \lfloor \theta_{REF}(m * T_{REF}) * (N + .f) \rfloor + \theta_{ERROR}(m * T_{REF})$$
$$= \theta p(m * T_{REF}) + \theta_{ERROR}(m * T_{REF}) - qE.$$

The quantization error qE introduced by the counter 36 in the digital estimate $\theta_{EST}$(m*$T_{REF}$) is substantially reduced by generating correlated quantization noise in a generated prediction signal $\theta s$(m*$T_{REF}$) to cancel the round-off error of the counter. Correlated quantization noise qE is generated in the phase predictor 39 by truncating its output value, the prediction signal $\theta s$(m*$T_{REF}$), to an integer. This truncation at the phase predictor 39 mimics the rounding-off that takes place in the counter 36. As a result of the truncation, the prediction signal $\theta s$(m*$T_{REF}$)=$\theta p$(m*$T_{REF}$). By subtracting the term $\theta_{EST}$(m*$T_{REF}$) from $\theta s$(m*$T_{REF}$) at the summer, which in this case is a bipolar digital adder 40, the predictable phase term $\theta p$(m*$T_{REF}$) and the quantization error term qE are canceled, leaving the phase error term $\theta_{ERROR}$ (m*$T_{REF}$) at the output 40C of the adder 40.

To assure that quantization noise qE is canceled at all output signal frequencies $F_{OUT}$, including those frequencies at which the fraction .f is zero, the integer divide ratio $N_{DIV}$ is chosen to differ from the integer N by a predetermined integer value. For example, the divide ratio $N_{DIV}$ is set equal to N−1. The reference signal 3 and the divided signal 9 are then assured to be asynchronous at the gate generator 34's inputs 34a, 34b, even at output signal frequencies $F_{OUT}$ at which the fraction .f is zero, thereby maintaining the quantization noise cancellation. Choosing the divide ratio $N_{DIV}$ in this manner also reduces spurious signals on the output signal 5 that would result in the absence of the shifting. Even for low values of the fraction .f, the frequency difference between reference signal 3 and the terminal count 9 is greater than $F_{REF}$/(N−1) which may be positioned well outside of the bandwidth of the PLL. Spurious signals generated from this frequency difference are readily filtered by the PLL's digital filter 42. For example, if $F_{REF}$=10 MHZ and the output frequency $F_{OUT}$ is between 500 MHZ and 1000 MHZ, the lowest frequency spurious signal occurs at 10 MHZ/(50−1)≈50.251 kHz. A PLL loop bandwidth of approximately 5 kHz, sufficiently filters the spurious signals at the output 25 of the frequency synthesizer 30.

The digital estimate $\theta_{EST}$(m*$T_{REF}$) of the time-varying phase $\theta_{OUT}$(t) of the output signal 5 obtained by the divider 14, gate generator 34 and counter 36 is the result of an analog-to-digital conversion and is subject to non-linearities inherent in analog-to-digital conversion processes. Linearization is performed using a dither generator 50 positioned between the clock generator 38 and the LATCH input of the counter 36 to add a random time variation to the counter 36's latch signal Dclk. The random time variation induced in the latch signal Dclk by the dither block 50 provides a corresponding random variation in the latched value $\theta_{EST}$ (m*$T_{REF}$) of the counter 36 sufficient to linearize the relationship between the analog time-varying phase $\theta_{OUT}$(t) of the VCO 12 and the digital estimate $\theta_{EST}$(m*$T_{REF}$).

Figure 4:
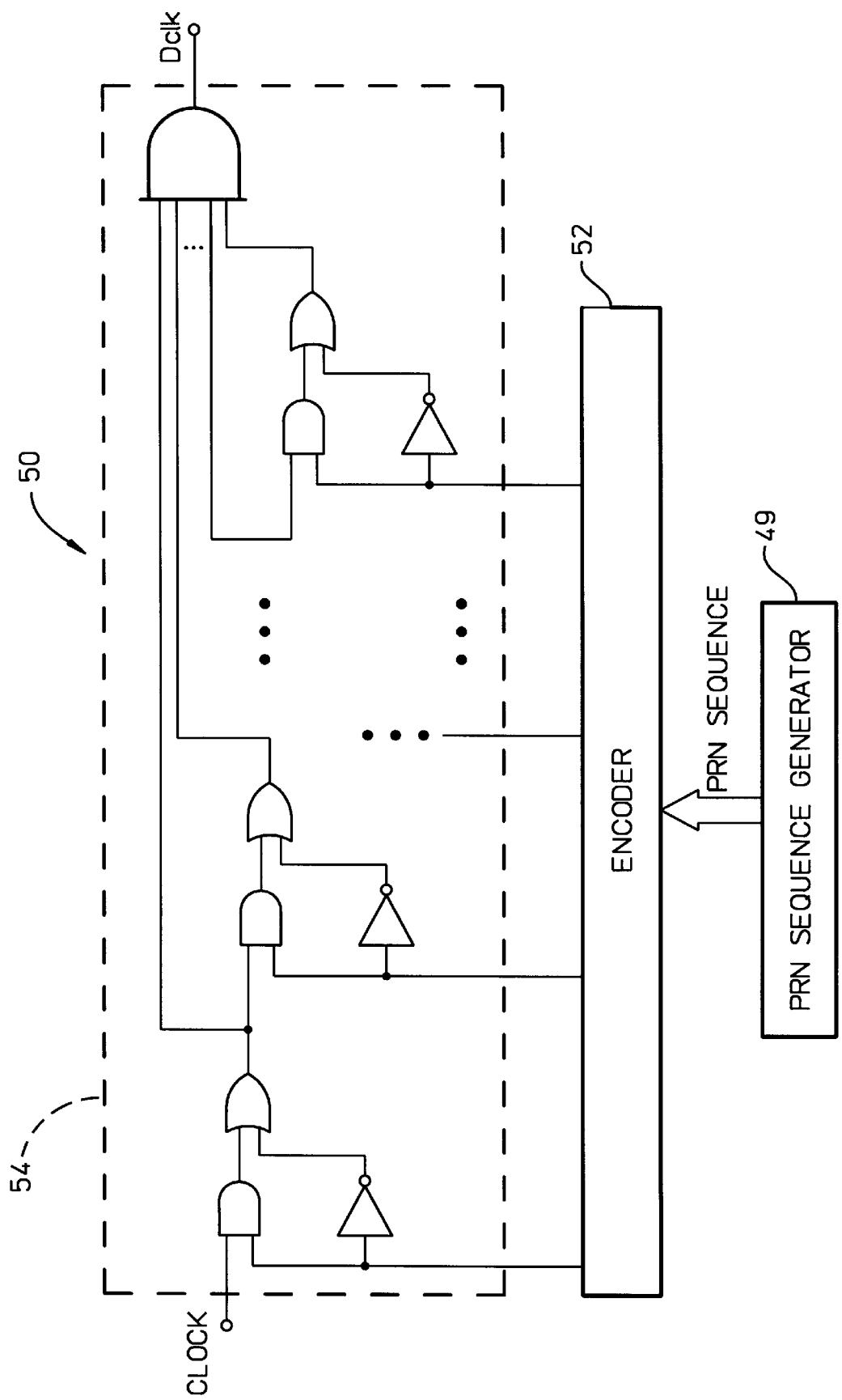
FIG. 4 shows a dither generator incorporated into the frequency synthesizer of FIG. 3.

FIG. 4 shows one implementation of the dither generator 50. A PRN sequence generated by the PRN sequence generator 49 is applied to an encoder 52. The encoder 52 maps each integer input from the PRN sequence generator 49 to a corresponding logic value that has the number of bits set high equivalent to the integer input. The logic values from the encoder 52 are applied to a logic delay block 54 which introduces propagation delays through the logic delay block according to the logic values from the encoder 52. The random nature of the logic values induces the random time variations in the reference signal 3 to produce the dithered latch signal Dclk. The random time variations in the dithered latch signal Dclk, introduce variations in the latched value $\theta_{EST}$(m*$T_{REF}$) of the counter 36 equivalent to multiple cycles of the output signal 5.

Alternatively, the dither generator 50 is coupled in series (not shown) with the second input 34b of the gate generator 34 and receives the reference signal 3. The series connection of the dither generator 50 adds random time variations, or jitter, to the reference signal 3 that is then applied to the second input 34b. This jitter generates random time variation to the gate interval td, inducing a corresponding random variation in the latched value $\theta_{EST}$(m*$T_{REF}$) of the counter 36 sufficient to linearize the relationship between the analog time-varying phase $\theta_{OUT}$(t) of the VCO 12 digital estimate $\theta_{EST}$(m*$T_{REF}$). Typically, the random time variations in the gate interval td, introduce variations in the latched value $\theta_{EST}$(m*$T_{REF}$) of the counter 36 equivalent to multiple cycles of the output signal 5.

The phase predictor 39 includes a b-bit accumulator 27, followed by a fixed gain block 23. The accumulator 27 is clocked at the reference frequency $F_{REF}$ or at an integer sub-multiple thereof. The output of the accumulator 27 represents to resolution $2^{-b}$, where b is the capacity in bits of accumulator 27, the number of cycles, including fractional portions of cycles, which the phase of the VCO 12, when operating at the target output frequency of (N+.f) *$F_{REF}$, is predicted to advance during the gate interval td. The b-bit word at the output of accumulator 27 is passed to gain block 23. The gain block 23 scales the b-bit word by the rational frequency multiplier (N+.f). The (p+b)-bit word at the output of gain block 23 is truncated to an integer by passing only the p most significant bits (MSBs) to the adder 40. The number of MSBs p, is greater than or equal to $LOG_2(N_{DIV})$, the divider 14's capacity in bits. The resulting prediction signal $\theta s$(m*$T_{REF}$) at the output of the gain block 23 represents the number of integer cycles by which the phase of the VCO 12, when operating at the target frequency, is predicted to advance during gate interval td. When $F_{OUT}$/ $N_{DIV}$>$F_{REF}$, the gate interval td decreases linearly from its maximum value $T_{REF}$ to zero in N/(N−$N_{DIV}$+.f) cycles of the reference signal 3, at which point the gate interval td resets back to its maximum time value $T_{REF}$. This cycle then repeats. For example, if the gate interval td=0 at t=0, the mth gate interval td, is represented as $$t_d(m * T_{REF}) = -\left( \frac{N + .f - N_{DI}}{N} * m * T_{REF} \right) \bmod T_{REF}$$

seconds, where mod represents the modulus function. If the phase error $\theta_{ERROR}$(m*$T_{REF}$) is not included, during a gate interval td(m*$T_{REF}$), the phase of the output signal 5 is predicted to advance td(m*$T_{REF}$)*$F_{REF}$* (N+.f) cycles or $$\left( \left( -\frac{N + .f - N_{DI}}{N} * m * T_{REF} \right) \bmod T_{REF} \right) * F_{REF}(N + .f) =$$

$$\left( \left( -\frac{N + .f - N_{DI}}{N} * m \right) \bmod 1 \right) * (N + .f)$$

cycles. This predicted phase advance td(m*$T_{REF}$)*$F_{REF}$* (N+.f) is generated using a uni-polar accumulator 27 that subtracts (N−$N_{DIV}$+.f)/N from its previous output at every clock period $T_{REF}$ and whose full scale value is unity. The b-bits, once passed to gain block 23 and scaled by (N+.f) result in (p+b)-bits which are truncated to p bits, thereby mimicking the truncate-to-integer function performed by the counter 36, which can only count an integer number of complete output signal cycles. The resulting p-bit word provides the prediction signal θs(m*T_REF) equal to $$\left\lfloor \left(\left(-\frac{N+f-N_{DI}}{N} * m\right) \mod 1\right) * (M+f) \right\rfloor$$

which is applied to the adder 40 and is compared to the integer number of cycles θ_OUT(m*T_REF) of output signal 5 counted during gate interval td(m*T_REF) by the counter 36.

Except when an accumulator underflow event and a gate interval reset event do not occur during the same clock period T_REF, the output of adder 40, which is the difference between the prediction signal θs(m*T_REF) and the counted cycles θ_EST(m*T_REF) at the end of the gate interval td(m*T_REF), corresponds to the phase error θ_ERROR (m*T_REF), once underflow compensation is provided for the accumulator 27. When an accumulator underflow event and a gate interval reset event do not occur during the same clock period T_REF, the phase error θ_ERROR(m*T_REF) does not correspond to the phase deviation of the output signal 5 from the predictable phase component θp(m*T_REF). For example, if it is assumed that the phase of the output signal 5 lags the predicted value held on the accumulator 27 by one cycle, during some clock period T_REF the accumulator 27 will underflow and output a full-scale value for that sample. At the output of the phase predictor 39, the prediction signal θs(m*T_REF) has the value N for that sample. Due to the lagging phase of the output signal 5, the gate interval td(m*T_REF) will be near its minimum value for that sample and the counter 36 will count one output signal cycle. Thus, the phase error θ_ERROR(m*T_REF) would indicate that the phase θ_OUT(t) of output signal 5 is ahead of the prediction signal θs(m*T_REF) by N−1 cycles. Likewise, when the phase of output signal 5 leads the predicted phase by one VCO cycle, the clock period during which gate interval td(m*T_REF) resets to its maximum value T_REF yields a phase error θ_ERROR(m*T_REF), which indicates that the phase θ_OUT (t) of output signal 5 lags the prediction signal θs(m*T_REF) by N−1 cycles.

Figure 5:
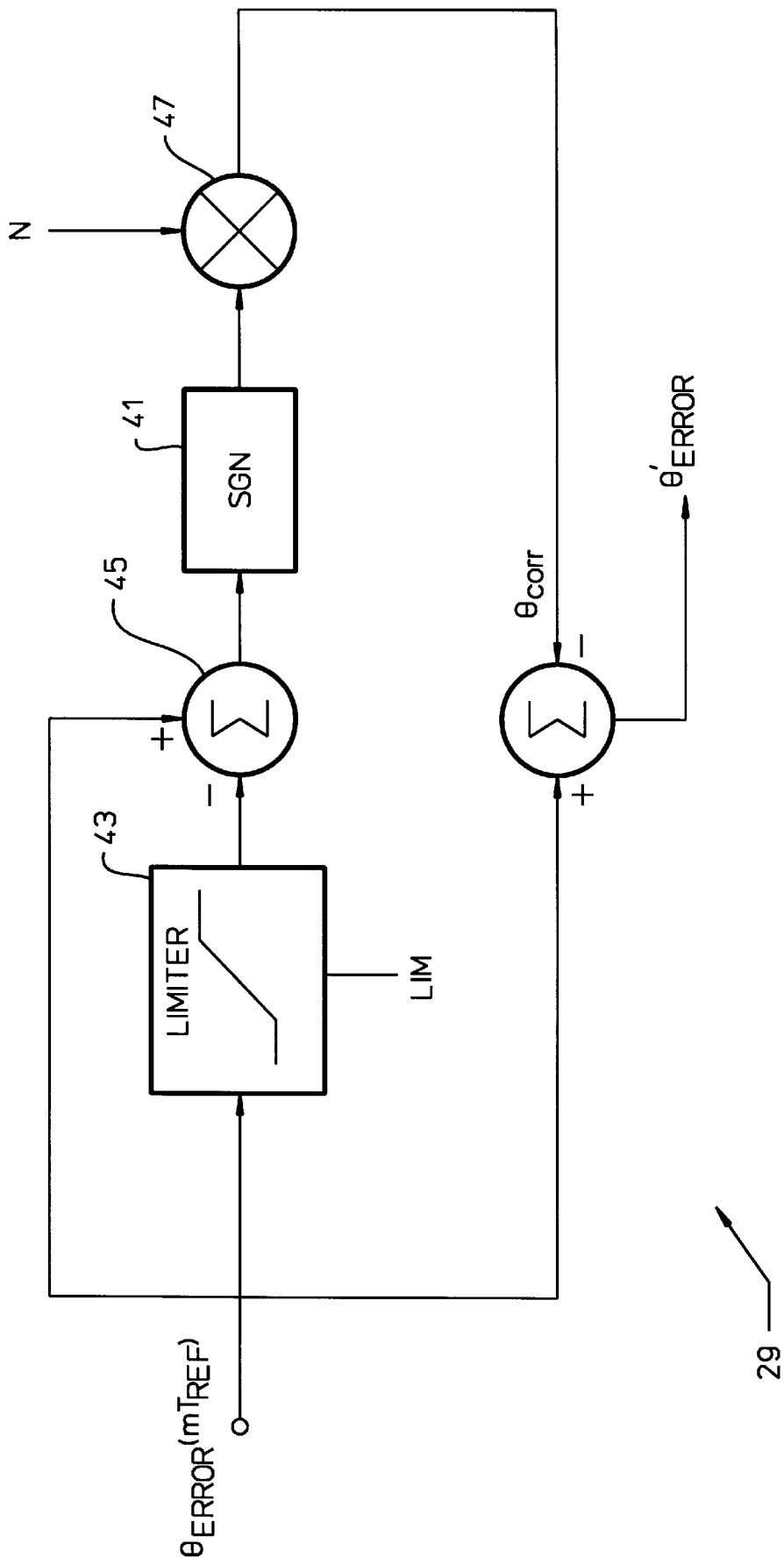
FIG. 5 shows an underflow compensator incorporated into the frequency synthesizer of FIG. 3.

An underflow compensator 29 compensates the phase error θ_ERROR(m*T_REF) for the noncoincidental underflow and gate interval reset events. One implementation of the underflow compensator 29 is shown in FIG. 5. The underflow compensator 29 receives the error term θ_ERROR (m*T_REF) from the output of the adder 40. The error term is then compared to a limit value LIM of limiter 43 at comparator 45. The 2-bit output of a Signum Function Block (SGN) 41 is 1 when θ_ERROR(m*T_REF)>LIM, is −1 when θ_ERROR(m*T_REF)<LIM, and 0 when −LIM≦θ_ERROR (m*T_REF)≦LIM. The output of the Signum Function Block 41 is multiplied by N at multiplier 47 to form an underflow correction term θ_CORR. The underflow correction term θ_CORR is subtracted from the phase error θ_ERROR(m*T_REF) to form a compensated phase error θ'_ERROR which is passed to digital filter 42. The value of LIM is chosen to be ⌊N/2⌋ to provide maximum range for the compensated phase error θ'_ERROR, where ⌊ ⌋ indicates the truncate-to-integer function.

The resulting compensated phase error θ'_ERROR represents phase deviations between the VCO output signal 5 and the reference signal 3. This compensated phase error θ'_ERROR is applied to the digital filter 42 which controls the loop dynamics of the frequency synthesizer 30. The bandwidth of the digital filter 42 can be adjusted by the controller 15. For example, to decrease acquisition and settling times of the frequency synthesizer 30, the bandwidth is temporarily increased. Once the PLL is locked, the bandwidth can be decreased to optimize noise performance and spurious signal filtering. The output of the digital filter 42 provides a digital input signal 33 to an digital-to-analog converter (DAC) 44 which converts the digital input 33 into the analog control signal 7 signal used to steer the frequency F_OUT of the VCO

12. The digital filter may include an optional dither source to randomize the low order bits of the DAC 44 to eliminate quantization error in the control signal 7 caused by the DAC 44. The phase-lock-loop minimizes the phase error by steering the frequency F_OUT of the output signal 5 to equal F_REF(N+.f), the rational frequency multiple of the reference signal 3.

Alternatively, a frequency synthesis method generates an output signal 5 at a frequency equal to a rational frequency multiple (N+.f) of the applied reference signal 3. The frequency synthesis method is not limited to implementations using the frequency synthesis apparatus of FIG. 2 or FIG. 3 and includes a series of steps. First, the output signal is divided in frequency by an integer divisor. Then, the cycles of the output signal are counted during the time interval td, determined from the time difference between corresponding amplitude transitions of the frequency-divided output signal and the reference signal, to produce an error term and a predictable term due to the known frequency difference between the output signal and the reference signal. Then, a prediction signal is generated and compared to the counted number of cycles to isolate the error term. The error term is then filtered and used to adjust the frequency of the output signal so that the frequency of the output signal approaches the rational frequency multiple of the reference signal as the error term is minimized. The frequency synthesis method may also include the step of linearizing the relationship between the counted number of cycles and the time interval td between corresponding amplitude transitions of the divided output signal and the reference signal 3. One implementation of the step of linearizing includes the step of adding random time variation to the time interval over which cycles of the output signal are counted.

From the forgoing it will be apparent that the frequency synthesis apparatus and method provided by the present invention generate an output signal at a rational frequency multiple of an applied reference signal using integer frequency divisors, thereby, reducing the presence of spurious signals on the output signal.

What is claimed is:

1. A variable frequency synthesizer for generating an output signal related in frequency to an applied reference signal by a rational frequency multiplier, comprising:

a variable frequency oscillator having an input receiving a control signal and having an output providing the output signal having a frequency responsive to the control signal;

a frequency divider coupled to the output of the variable frequency oscillator, receiving the output signal and dividing the frequency of the output signal by an integer divisor to produce a divided signal;

a phase comparator coupled to the frequency divider, receiving the divided signal at a first input and receiving the reference signal at a second input and producing a phase difference signal having a predictable component and an error component;

a phase prediction signal generator receiving the reference signal and generating a cancellation signal identical to the predictable component according to the reference signal, the integer divisor, and the rational frequency multiplier;

a summer having a first input coupled to the phase comparator and receiving the phase difference signal, having a second input coupled to the phase prediction signal generator and receiving the cancellation signal, and taking the difference of the cancellation signal and the phase difference signal, providing the error component at an output; and a filter coupled between the output of the summer and the input of the variable frequency oscillator, receiving the error component and processing the error component to generate the control signal, the control signal adjusting the frequency of the output signal to reduce the error component.

2. The variable frequency synthesizer of claim 1 further comprising a controller coupled to the frequency divider selecting the integer divisor and coupled to the phase prediction signal generator, providing the rational frequency multiplier and the integer divisor to the phase prediction signal generator.

3. The variable frequency synthesizer of claim 2 whereby the frequency of the output signal is selected by adjusting the rational frequency multiplier and the integer divisor.

4. The variable frequency synthesizer of claim 3 wherein the reference signal has a time varying phase and the predictable component equals the time varying phase multiplied by, one minus the rational frequency multiplier, divided by the integer divisor.

5. The variable frequency synthesizer of claim 4 wherein the variable frequency oscillator comprises a voltage controlled oscillator having a pretune input for adjusting the frequency of the output signal.

6. The variable frequency synthesizer of claim 5 wherein the phase comparator comprises a mixer.

7. A variable frequency synthesizer for generating an output signal related in frequency to an applied reference signal by a rational frequency multiplier, comprising:

a variable frequency oscillator having an input receiving a control signal and having an output providing the output signal having a frequency responsive to the control signal;

a frequency divider coupled to the output of the variable frequency oscillator, receiving the output signal and dividing the frequency of the output signal by an integer divisor to produce a divided signal;

a gate generator coupled to the output of the frequency divider, receiving the divided signal at a first input and receiving the reference signal at a second input, the gate generator responsive to the time difference between corresponding amplitude transitions of the divided signal and the reference signal at the first and second inputs, generating a pulse at an output of the gate generator according to the time difference;

a counter coupled to the output of the variable frequency oscillator, receiving the output signal and coupled to the output of the gate generator, receiving the pulse, the counter counting the number of cycles of the output signal within the duration of the pulse to provide a count value at the output of the counter, the count value including a predicted number of cycles of the output signal and an error term;

a phase predictor receiving the reference signal, the rational frequency multiplier and the integer divisor and generating an output value equal to the predicted number of cycles of the output signal at its output;

an adder coupled to the output of the counter and phase predictor, subtracting the count value and the output value to provide the error term at the output of the adder;

processing means coupled to the output of the adder, filtering the error term; and a digital-to-analog converter coupled to the processing means, receiving the digitally processed error term and producing the control signal, the control signal adjusting the frequency of the output signal to minimize the error term.

8. The variable frequency synthesizer of claim 7 further comprising a controller coupled to the frequency divider, selecting the integer divisor and coupled to the phase predictor, providing the rational frequency multiplier and the integer divisor to the phase predictor.

9. The variable frequency synthesizer of claim 7 wherein;

the rational frequency multiplier comprises the summation of an integer value and a fractional value, the phase predictor includes an accumulator and a gain block, the accumulator subtracting the difference between the rational frequency multiplier and the integer divisor, divided by the integer value, clocked according to the reference signal, the gain block coupled to the accumulator and to the processing means, scaling the accumulated value by the rational frequency multiplier, and the processing means including an underflow compensator for the accumulator and a filter, the underflow compensator coupled to the output of the adder and the filter.

10. The variable frequency synthesizer of claim 9 wherein the resolution of the accumulator is greater than the resolution of the counter and the gain block truncates the accumulated value to equal the resolution of the counter.

11. The variable frequency synthesizer of claim 7 further comprising a clock generator and a dither generator, the clock generator receiving the reference signal and producing a clock signal from the reference signal, the dither generator coupled to the clock generator, receiving the clock signal and adding random timing uncertainty to the clock signal to produce a latch signal for the counter.

12. The variable frequency synthesizer of claim 7 further comprising a dither generator coupled to the first input of the gate generator and receiving the reference signal, the dither generator adding random time uncertainty to the reference signal to provide a corresponding random time uncertainty to the duration of the pulse generated at the output of the gate generator.

13. A frequency synthesis method for generating an output signal at a rational frequency multiple of a reference signal, comprising the steps of:

dividing the frequency of the output signal;

counting the number of output signal cycles occurring in a time interval between corresponding amplitude transitions of the the divided output signal and the applied reference signal, to generate a counted value and an error term;

generating a prediction term equal to the counted value;

comparing the prediction term to the counted value to isolate the error term; and adjusting the frequency of the output signal to equal the rational frequency multiple of the reference signal as the error term is minimized.

14. The frequency synthesis method of claim 13 further comprising the step of linearizing the relationship between the counted number of cycles and the time interval between corresponding amplitude transitions of the divided output signal and the reference signal.

15. The frequency synthesis method of claim 14 wherein the step of linearizing includes the step of adding random time variation to the time interval over which cycles of the output signal are counted.

* * * * *